(12) United States Patent
Matsuki et al.

(10) Patent No.: US 7,566,577 B2
(45) Date of Patent: Jul. 28, 2009

(54) SEMICONDUCTOR LASER DEVICE AND METHOD OF MANUFACTURING THE SAME

(75) Inventors: Yoshiyuki Matsuki, Okayama (JP); Masaya Mannoh, Hyogo (JP); Toshiya Fukuhisa, Osaka (JP); Tsutomu Ukai, Hyogo (JP)

(73) Assignee: Panasonic Corporation, Osaka (JP)

( * ) Notice: Subject to any disclaimer, the term of this patent is extended or adjusted under 35 U.S.C. 154(b) by 582 days.

(21) Appl. No.: 11/504,658

(22) Filed: Aug. 16, 2006

(65) Prior Publication Data

US 2007/0058687 A1    Mar. 15, 2007

(30) Foreign Application Priority Data

Sep. 15, 2005   (JP) ............................. 2005-267730

(51) Int. Cl.
   *H01L 21/02*   (2006.01)
(52) U.S. Cl. ..................................... 438/35
(58) Field of Classification Search .................. None
   See application file for complete search history.

(56) References Cited

U.S. PATENT DOCUMENTS

2007/0264738 A1* 11/2007 Nishida et al. ............... 438/35

FOREIGN PATENT DOCUMENTS

JP        2001-345514       12/2001

* cited by examiner

*Primary Examiner*—Paul Huber
(74) *Attorney, Agent, or Firm*—Steptoe & Johnson LLP

(57) ABSTRACT

A semiconductor laser device in which a red semiconductor laser device and an infrared semiconductor laser device are located on a single substrate, and an end-face window structure is formed simultaneously. The hydrogen concentration ($1.5e^{18}$ cm$^{-3}$) of a fourth clad layer (110) of the infrared semiconductor laser device is higher than the hydrogen concentration ($1e^{18}$ cm$^{-3}$) of a second clad layer (105) of the red semiconductor laser device which is a first semiconductor laser device, whereby an active layer of the infrared semiconductor laser device can be sufficiently disordered in the semiconductor laser device.

8 Claims, 4 Drawing Sheets

SEMICONDUCTOR LASER DEVICE AND METHOD OF MANUFACTURING THE SAME

BACKGROUND OF THE INVENTION

1. Field of the Invention

The present invention relates to easily forming an end-face window when semiconductor laser devices having emission wavelengths different from each other are manufactured on a substrate.

2. Description of the Related Art

Currently, an optical disk such as a DVD (Digital Versatile Disk) or a CD (Compact Disk) is actively used as a high-capacity optical medium which can record information in large quantities. A red semiconductor laser device of an emission wavelength of 650 nm is used in the DVD and an infrared semiconductor laser device of an emission wavelength of 780 nm is used in the CD.

Recently, in order to read both disks such as DVD and CD, an optical pick-up is used that corresponds to the both disks each including both a red semiconductor laser device having a wavelength of 650 nm and an infrared semiconductor laser device having a wavelength of 780 nm. The mainstream of conventional double wavelength semiconductor laser devices is a monolithic structure in which the red semiconductor laser device and infrared semiconductor laser device are located on a single substrate.

FIGS. 4A, 4B, 4C and 4D show a method of manufacturing a conventional double wavelength semiconductor laser device.

First, as shown in FIG. 4A, a double hetero structure 121 of an infrared semiconductor laser device 8 is formed on a first conductive-type (n) GaAs substrate 1. More specifically, the double hetero structure 121 of the infrared semiconductor laser device 8 is formed on the first conductive-type (n) GaAs substrate 1 by stacking thereon a first conductive-type (n) GaAs buffer layer 2, a first conductive-type (n) AlGaInP clad layer 3, an active layer 4 of multi-quantum well structure comprised of a GaAs well layer and an AlGaAs barrier layer, a second conductive-type (p) AlGaInP clad layer 5, a second conductive-type (p) GaInP intermediate layer 6, a second conductive-type (p) GaAs contact layer 7, and a second conductive-type (p) AlGaAs layer (not shown).

Next, after the second conductive-type AlGaAs layer is selectively removed in a stripe shape, the double hetero structure of the infrared semiconductor laser device 8 in an area where the double hetero structure of the red semiconductor laser device 15 is formed is removed by etching as shown in FIG. 4B.

Next, as shown in FIG. 4C, a double hetero structure 122 of a red semiconductor laser device 15 is formed on the first conductive-type GaAs substrate 1. More specifically, the double hetero structure 122 of the red semiconductor laser device 15 is formed on the first conductive-type GaAs substrate 1 by stacking thereon a first conductive-type (n) GaAs buffer layer 9, a first conductive-type (n) AlGaInP clad layer 10, an active layer 11 of multi-quantum well structure comprised of a GaInp well layer and an AlGaInp barrier layer, a second conductive-type (p) AlGaInP clad layer 12, a second conductive-type (p) GaInP intermediate layer 13, and a second conductive-type (p) GaAs contact layer 14.

Next, as shown in FIG. 4D, after the red semiconductor laser device 15 on the infrared semiconductor laser device 8 is removed, an end-face window structure is formed by masking apart excluding an end-face window portion is masked, depositing ZnO on the end-face window portion, and annealing the ZnO deposited portion at 600° C. to selectively diffuse Zn. At this time, in the end-face window structure, active layers of the double hetero structure of the red semiconductor laser device 8 and the double hetero structure of the infrared semiconductor laser device 15 include Zn of approximately $3e^{18}$ cm$^{-3}$.

As a patent document describing the above mentioned simultaneous formation of the end-face window structure of the double wavelength semiconductor laser device, Japanese Unexamined Patent Application Publication No. 2001-345514 may be cited.

In the double hetero structure of a double wavelength semiconductor laser device, the end-face window structure serves, with ZnO as a diffusion source, penetrate Zn into an active layer via a second conductive-type clad layer made of AlGaInP in which phosphorus is a V-group mother element, thereby causing the active layer of a multi-quantum well structure to be disordered. The active layer 11 of the red semiconductor laser device 15 is disordered at a relatively low temperature of approximately 600° C. if the active layer includes Zn of $1e^{18}$ cm$^{-3}$ or more. Meanwhile, the active layer 4 of the infrared semiconductor laser device 8 requires Zn of high concentration of $1e^{19}$ cm$^{-3}$ or more at the same temperature as that of the active layer 11 of the red semiconductor laser device 15.

As described above, in the active layer 4 of the infrared semiconductor device 8, although Zn is required to be excessively diffused, when an end-face window structure is simultaneously formed, the diffusion of Zn to the active layer 4 of the infrared semiconductor layer 8 becomes insufficient. Hence, there arises a problem that sufficient disorder does not occur, and the active layer 4 does not serve as the end-face window structure.

SUMMARY OF THE INVENTION

An object of the present invention is to provide a monolithic double wavelength semiconductor laser device having a desired end-face window structure by occurrence of sufficient disorder in the active layer of an infrared semiconductor laser and a method of manufacturing the same even in case the red semiconductor laser device and the infrared semiconductor laser device are located on a single substrate and the end-face window is formed simultaneously.

Provided according to the first aspect of the present invention is a monolithic double wavelength semiconductor laser device including a first semiconductor laser device and a second semiconductor laser device respectively formed on a first conductive-type substrate and having different emission wavelengths, wherein the monolithic double wavelength semiconductor laser device has an end-face window structure, the first semiconductor laser device has a double hetero structure having, in stacked manner on the first semiconductor laser device, a first clad layer of a first conductive type, a first active layer of a multi-quantum well structure, and a second clad layer of a second conductive type, the second semiconductor laser device has a double hetero structure having a third clad layer of the first conductive type, a second active layer of the multi-quantum well structure, and a fourth clad layer of the second conductive type. Herein, the fourth clad layer of the second semiconductor laser device has a hydrogen concentration higher than that of the second clad layer of the first semiconductor laser device.

A monolithic double wavelength semiconductor laser device according to the second aspect of the invention is the monolithic double wavelength semiconductor laser device of the first aspect, wherein the hydrogen concentration in the second clad layer of the second conductive type of the first semiconductor laser device is higher than that of the first clad layer of the first conductive type of the first semiconductor laser device, and the hydrogen concentration in the fourth clad layer of the second conductive type of the second semiconductor laser device is higher than that of the third clad layer of the first conductive type of the second semiconductor laser device.

Provided according to the third aspect of the present invention is a method of manufacturing a monolithic double wavelength semiconductor laser device, comprising the steps of: forming a double hetero structure of a first semiconductor laser device having, in a stacked manner on the first conductive-type substrate, a first clad layer of a first conductive type, a first active layer of a multi-quantum well structure, a second clad layer of a second conductive type, and a first contact layer of a second conductive type; etching and removing a part of the double hetero structure of the second semiconductor laser device formed on the double hetero structure of the first semiconductor laser device; forming a double hetero structure of a second semiconductor laser device having a third clad layer of a first conductive type, a second active layer of a multi-quantum well structure, a fourth clad layer of a second conductive type, and a second contact layer of the second conductive type; etching and removing the double hetero structure of the second semiconductor laser device formed on the double hetero structure; annealing the double hetero structure of the second semiconductor laser device in an atmosphere of hydride; and forming an impurity film on an end-face portion of the lamination structure, heat-treating the impurity film, diffusing impurities simultaneously onto the first active layer and the second active layer, and forming an end-face window structure.

A monolithic double wavelength semiconductor laser device according to the fourth aspect of the invention is the monolithic double wavelength semiconductor laser device of the first aspect, wherein the double hetero structure of the first semiconductor laser device is a red semiconductor laser device and the double hetero structure of the second semiconductor laser device is an infrared semiconductor laser device.

A monolithic double wavelength semiconductor laser device according to the fifth aspect of the invention is the monolithic double wavelength semiconductor laser device of the third aspect, wherein the double hetero structure of the first semiconductor laser device is a red semiconductor laser device and the double hetero structure of the second semiconductor laser device is an infrared semiconductor laser device.

A method of manufacturing the monolithic double wavelength semiconductor laser device according to the sixth aspect of the invention is the method of the third aspect, wherein the double hetero structure of the first semiconductor laser device is formed prior to the double hetero structure of the second semiconductor laser device.

A monolithic double wavelength semiconductor laser device according to the seventh aspect of the invention is the monolithic double wavelength semiconductor laser device of the first aspect, wherein the first clad layer of the first conductive type and the second clad layer of the second conductive type of the first semiconductor laser device, and the third clad layer of the first conductive type and the fourth clad layer of the second conductive type of the second semiconductor laser device are comprised of a materials including phosphorus.

A method of manufacturing the monolithic double wavelength semiconductor laser device according to the eighth aspect of the invention is the method of the third aspect, wherein the first semiconductor laser device and second semiconductor laser device use phosphorus as a V-group element.

By the foregoing configuration, when two semiconductor laser devices having different wavelengths are produced, the diffusion of Zn in the window area can be promoted by controlling the hydrogen concentration in the clad layer, so that the simultaneous window area production can be facilitated.

DESCRIPTION OF THE PREFERRED EMBODIMENTS

Hereinafter, a method of manufacturing a monolithic double wavelength semiconductor laser device according to the present invention will be described based on specific embodiments.

Figure 3:
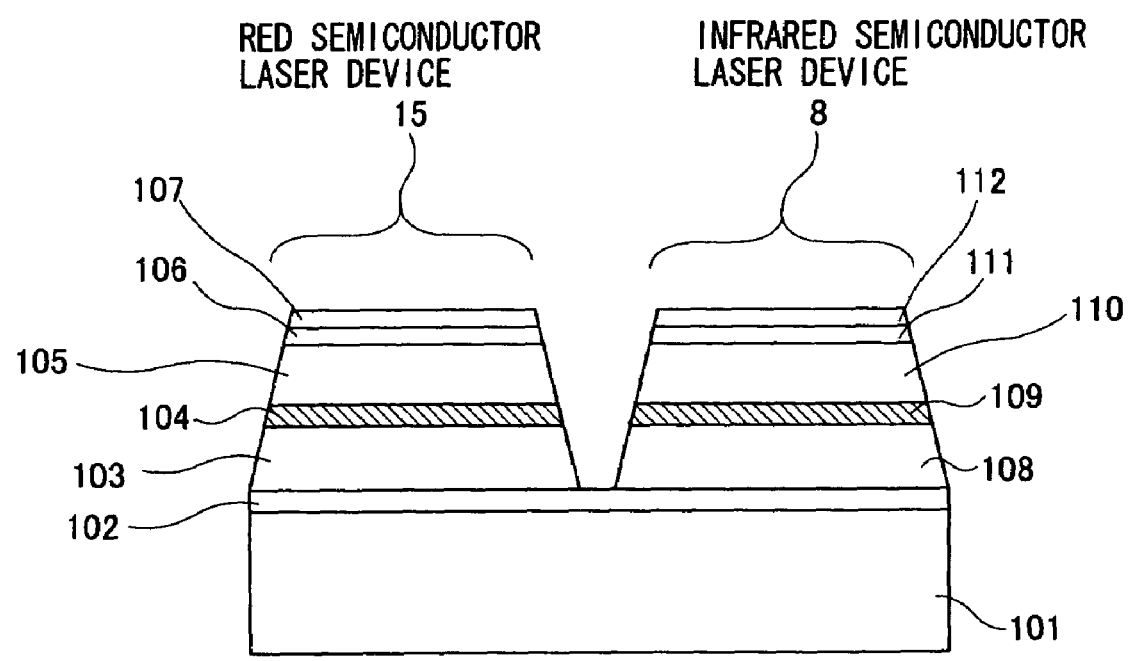
FIG. 3 is a cross-sectional view of a completed double wavelength semiconductor device according to the same embodiment of the present invention.
Figure 4A:
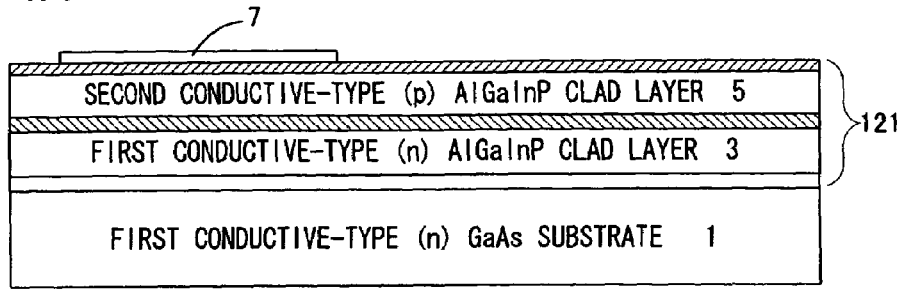
FIGS. 4A to 4D show manufacturing processes of a conventional double wavelength semiconductor laser device.
Figure 4B:
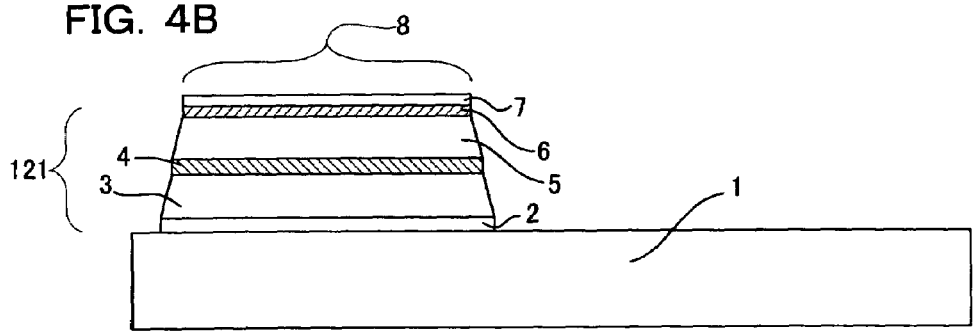
Figure 4C:
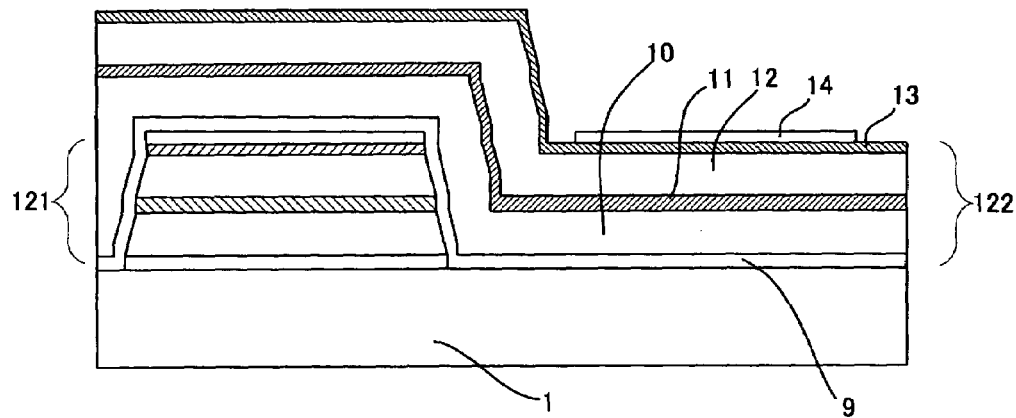
Figure 4D:
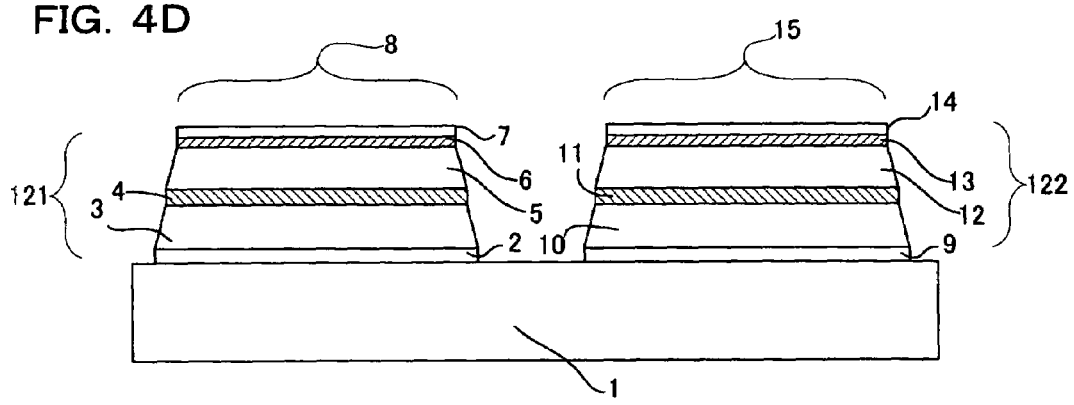

FIG. 3 shows a monolithic double wavelength semiconductor laser device according to the present invention.

In a double hetero structure 122 of a red semiconductor laser device 15, an n-GaAs buffer layer 102 and an n-AlGaInP clad layer 103 are formed in a part on a substrate 101 made of n-GaAs, and Si is added as an n-type impurity, whereby the impurity concentration is approximately $1e^{18}$ cm$^{-3}$.

An active layer (a first active layer) 104 of a multi-quantum well structure having an emission wavelength of 650 nm, which is comprised of a GaInP well layer and an AlGaInP barrier layer, is formed on the n-AlGaInP clad layer 103. The concentration of Zn included in the active layer 104 of the multi-quantum well structure having the emission wavelength of 650 nm, which is comprised of the GaInP well layer and the AlGaInP barrier layer in an end-face window area, is approximately $3e^{18}$ cm$^{-3}$.

A p-AlGaInP clad layer (a second clad layer) 105, a p-GaInP intermediate layer 106, and a p-GaAs contact layer 107 are formed on the active layer 104 of the multi-quantum well structure having the emission wavelength of 650 nm, and Zn is added as p-type impurity, whereby the impurity concentration is approximately $1e^{18}$ cm$^{-3}$.

In a double hetero structure 121 of an infrared semiconductor laser device 8, an n-GaAs buffer layer 102 to which Si of $1e^{18}$ cm$^{-3}$ is added and an n-AlGaInP clad layer (a third clad layer) 108 are formed on the n-GaAs substrate 101 in the vicinity of the double hetero structure of the red semiconductor laser device 15.

An active layer (a second active layer) 109 of the multi-quantum well structure having an emission wavelength of 780 nm, which is comprised of a GaAs well layer and an AlGaAs barrier layer, are formed on the n-AlGaInP clad layer 108.

The concentration of Zn in the active layer 109 of the multi-quantum well structure having the emission wavelength of 780 nm, which is comprised of the GaAs well layer and the AlGaAs barrier layer in the end-face window area, is approximately $1e^{19}$ cm$^{-3}$.

A p-AlGaInP clad layer 110 (a fourth clad layer) to which Zn of approximately $1e^{18}$ cm$^{-3}$ is added, a p-GaInP intermediate layer 111, and a p-GaAs contact layer 112 are formed on the active layer 109 of the multi-quantum well structure which is comprised of the GaAs well layer and the AlGaAs barrier layer and having the emission wavelength of 780 nm.

As described above, the double hetero structure of the red semiconductor laser device 15 and the double hetero structure of the infrared semiconductor laser device 8 are a monolithic structure.

The hydrogen concentration in the p-AlGaInP clad layer 105 of the double hetero structure of the red semiconductor laser device 15 is approximately $1e^{18}$ cm$^{-3}$, and the hydrogen concentration in the p-AlGaInP clad layer 110 of the double hetero structure of the infrared semiconductor laser device 8 is approximately $1.5e^{18}$ cm$^{-3}$. Therefore, the hydrogen concentration in the fourth clad layer 110 is higher than that of the second clad layer 105, so that Zn can be easily diffused.

Next, a forming procedure will be described.

Figure 1A:
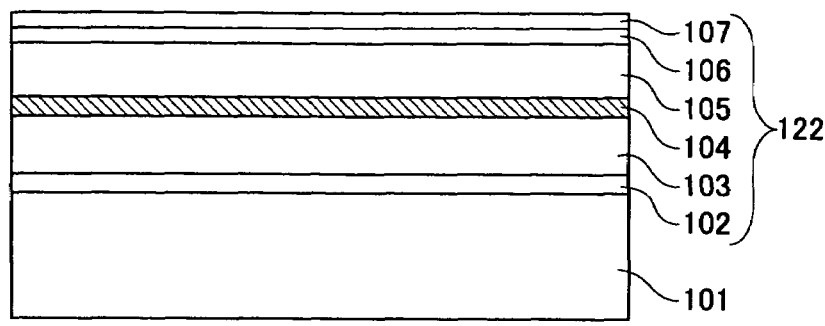
FIGS. 1A to 1C are cross-sectional views showing first-half processes of a method of manufacturing a double wavelength semiconductor laser device according an embodiment of the present invention.

By epitaxial deposition of the Metal Organic Vapor Chemical Deposition (MOVCD), as shown in FIG. 1A, an n-GaAs buffer layer 102 to which Si is added as impurity and an n-AlGaInP clad layer 103 are formed on the n-GaAs substrate 101 of 10 degrees off. The impurity concentration in the n-GaAs buffer layer 102 and n-GaInP clad layer 103 is approximately $1e^{18}$ cm$^{-3}$.

The active layer 104 of the multi-quantum well structure having the emission wavelength of 650 nm, which is comprised of the GaInP well layer and AlGaInP barrier layer, is formed on the n-AlGaInP clad layer 103.

The p-AlGaInP clad layer 105 to which Zn is added as impurity, the p-GaInP intermediate layer 106, and the p-GaAs contact layer 107 are epitaxially deposited on the active layer 104 in sequence, whereby a lamination structure constituting the double hetero structure of the red semiconductor laser device 15 is formed. The impurity concentration of Zn in the p-AlGaInP clad layer 105, p-GaInP intermediate layer 106, and p-GaAs contact layer 107 is approximately $1e^{18}$ cm$^{-3}$.

Next, a part of the double hetero structure of the red semiconductor laser device 15 is etched, whereby a deposition area of the double hetero structure of the infrared semiconductor laser device 8 is formed.

Figure 1B:
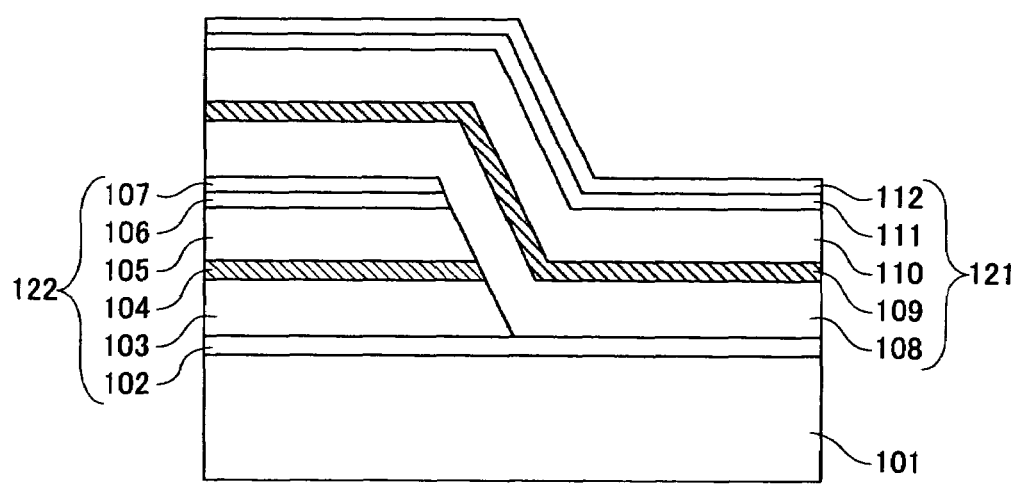

Next, as shown in FIG. 1B, the n-AlGaInP clad layer 108 to which Si is added as impurity is formed, and the impurity concentration thereof is approximately $1e^{18}$ cm$^{-3}$. The active layer 109 of the multi-quantum well structure having the emission wavelength of 780 nm, which is comprised of the GaAs well layer and AlGaAs layer, is on the n-AlGaInP clad layer 108. Moreover, the p-AlGaInP clad layer 110, p-GaInP intermediate layer 111, and p-GaAs contact layer 112 are epitaxially deposited in sequence, whereby the lamination structure constituting the infrared semiconductor laser device 8 is formed. The impurity concentration thereof is approximately $1e^{18}$ cm$^{-3}$.

Figure 1C:
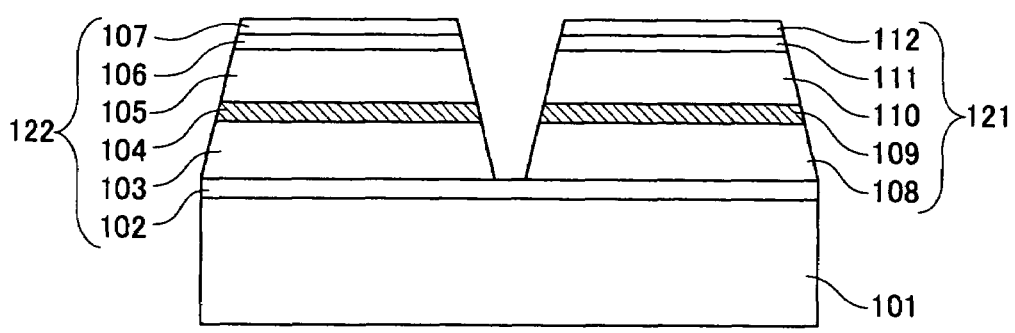

Next, as shown in FIG. 1C, the double hetero structure of the infrared semiconductor laser device 8 deposited on the double hetero structure of the red semiconductor laser device 15 is removed by etching.

Next, the p-AlGaInP clad layer 110 is annealed at a temperature of 500° C. under an atmosphere of arsine as hydride so as to increase the hydrogen concentration in the p-AlGaInP clad layer 110.

Figure 2A:
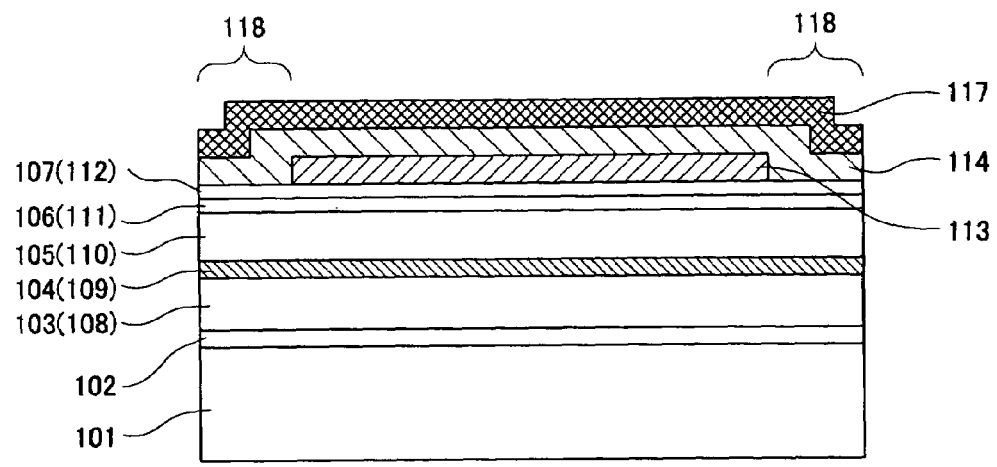
FIGS. 2A to 2C are lengthwise cross-sectional views of a resonance apparatus showing second-half processes of the method of manufacturing the double wavelength semiconductor laser device according to the embodiment of the present invention.
Figure 2B:
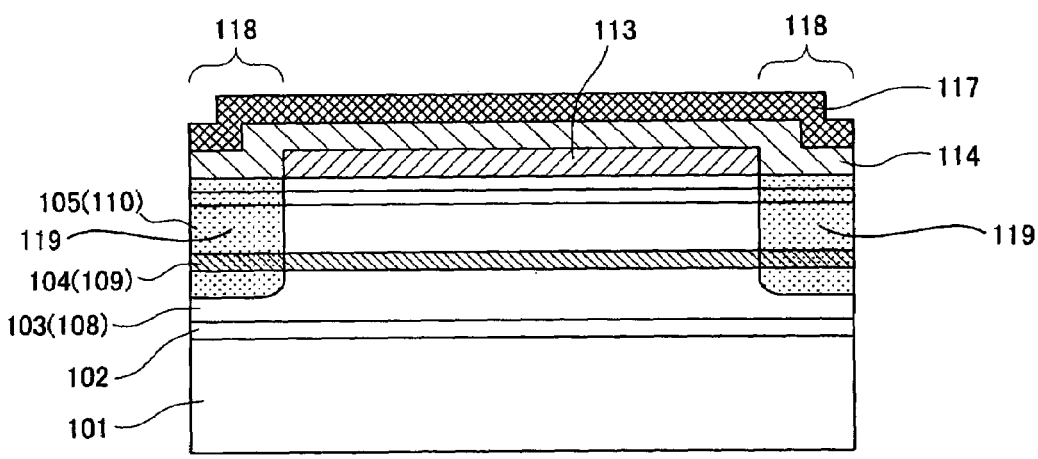
Figure 2C:
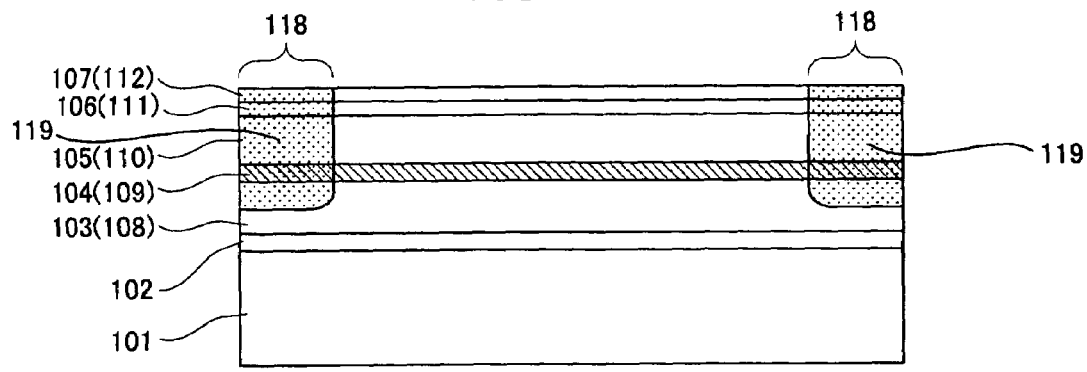

This treatment is performed in the processes shown in the side views (lengthwise cross sections of a resonator) of FIGS. 2A to 2C.

In FIG. 2A, a mask 113 is formed in a part excluding a window area 118 in the vicinity of an emission end-face and a ZnO film is deposited thereon as shown by 114, whereby a SiO$_2$ film is formed as another cap layer 117. Reference numerals within the parentheses correspond to the infrared semiconductor laser device 8, and reference numerals without the parentheses correspond to the red semiconductor laser device 15. In this state, the annealing is performed at 600° C., and Zn is selectively diffused as impurity as shown in FIG. 2B. More specifically, in a window area directly on which the ZnO film 114 is formed, Zn from a ZnO film 114 pushes out Zn in a lower layer or is directly diffused to the active layer 104 (or 109), whereby a high-concentration Zn diffusion area 119 is formed throughout the end-face, and an area to which Zn is diffused in the active layer 104 (or 109) becomes an area in which an MQW structure is disordered.

By the process described above, as shown in FIG. 2C, the Zn concentration in the end-face window portion 115 of the double hetero structure of the red semiconductor laser device 15 is approximately $3e^{18}$ cm$^{-3}$, and the hydrogen concentration thereof is approximately $1e^{18}$ cm$^{-3}$. The concentration of Zn in the end-face window portion 116 of the double hetero structure of a second infrared semiconductor laser device is approximately $1e^{19}$ cm$^{-3}$, and the hydrogen concentration therein is approximately $1.5e^{18}$ cm$^{-3}$.

A PL (Photoluminescence) wavelength of the end-face window portion in the double hetero structure of a first red semiconductor laser device is 600 nm, and a PL (Photoluminescence) wavelength of the end-face window portion in the double hetero structure of the second infrared semiconductor laser device is 730 nm, the structures being in a desired disordered state.

By the inventor's keen examination, it is found that if the hydrogen concentration in crystal increases, the inactivation of Zn is promoted, whereby the diffusion speed of Zn gets fast in the formation of the end-face window structure. In addition, since the double hetero structure in which the formation thereof has been previously performed loses hydrogen in the formation of the following double hetero structure, the Zn diffusion speed of a second conductive-type clad layer gets slow.

According to the present invention, since the double hetero structure of the infrared semiconductor laser device uses the multi-quantum well active layer comprised of the GaInP well layer and AlGaInP barrier layer is used, the double hetero structure of the infrared semiconductor laser device takes a longer time than the double hetero structure of the red semiconductor laser device that uses the multi-quantum well active layer comprised of the GaInP well layer and AlGaInP barrier layer for disordering the multi-quantum well structure by the Zn diffusion. To solve the problem described above, the hydrogen concentration in the fourth clad layer 110 of the second conductive type of the infrared semiconductor laser device 8 is established to be higher than the hydrogen concentration in the second clad layer 105 of the second conductive type of the red semiconductor laser device 15 by performing the formation from the double hetero structure of the red semiconductor laser device. Preferably, the difference between the hydrogen concentration in the fourth clad layer 110 and the hydrogen concentration in the second clad layer 105 is established to $0.5e^{18}$ cm$^{-3}$ or more. By this configuration, the Zn diffusion speed in the second conductive-type clad layer of the infrared semiconductor laser device, which takes a long time for disordering, gets fast, whereby a desired end-face window state of the monolithic double wavelength semiconductor laser device can be simultaneously formed.

Moreover, according to the present invention, the annealing is performed under an atmosphere of arsine, thereby purposely increasing the hydrogen concentration in the crystal. By this configuration, since the hydrogen concentration in the second conductive-type clad layer can be increased the diffusion speed of Zn gets fast, thereby reducing the annealing time for forming the end-face window structure.

Even when the red semiconductor laser device and the infrared semiconductor laser device are located on a single substrate, and the end-face window structure is simultaneously formed, the sufficient disordering occurs in the active layer of the infrared semiconductor laser device, whereby a double wavelength semiconductor laser device having the desired end-face window structure can be provided.

What is claimed is:

1. A monolithic double wavelength semiconductor laser device including a first semiconductor laser device and a second semiconductor laser device respectively formed on a first conductive-type substrate (101) and having different emission wavelengths, wherein the monolithic double wavelength semiconductor laser device has an end-face window structure, the first semiconductor laser device has a double hetero structure having, in a stacked manner on the first conductive-type substrate (101), a first clad layer (103) of a first conductive type, a first active layer (104) of a multi-quantum well structure, and a second clad layer (105) of a second conductive type, the second semiconductor laser device has a double hetero structure having a third clad layer (108) of the first conductive type, a second active layer (109) of the multi-quantum well structure, and a fourth clad layer (110) of the second conductive type, wherein the fourth clad layer (110) of the second semiconductor laser device has a hydrogen concentration higher than that of the second clad layer (105) of the first semiconductor laser device.

2. The monolithic double wavelength semiconductor laser device according to claim 1, wherein the hydrogen concentration of the second clad layer of the second conductive type of the first semiconductor laser device is higher than that of the first clad layer of the first conductive type of the first semiconductor laser device, and the hydrogen concentration of the fourth clad layer of the second conductive type of the second semiconductor laser device is higher than that of the third clad layer of the first conductive type of the second semiconductor laser device.

3. The monolithic double wavelength semiconductor laser device according to claim 1, wherein the double hetero structure of the first semiconductor laser device is a red semiconductor laser device, and the double hetero structure of the second semiconductor laser device is an infrared semiconductor laser device.

4. The monolithic double wavelength semiconductor laser device according to claim 1, wherein the first clad layer of the first conductive type and the second clad layer of the second conductive type of the first semiconductor laser device, and the third clad layer of the first conductive type and the fourth clad layer of the second conductive type of the second semiconductor laser device are comprised of a material including phosphorus.

5. A method of manufacturing a monolithic double wavelength semiconductor laser device, comprising:

forming a double hetero structure of a first semiconductor laser device (15) having, in a stacked manner on the first conductive-type substrate (101), a first clad layer (103) of a first conductive type, a first active layer (104) of a multi-quantum well structure, a second clad layer (105) of a second conductive type, and a first contact layer (107) of a second conductive type;

etching and removing a part of the double hetero structure of the first semiconductor laser device (15);

forming a double hetero structure of a second semiconductor laser device (8) having a third clad layer (108) of a first conductive type, a second active layer (109) of a multi-quantum well structure, a fourth clad layer (110) of a second conductive type, and a second contact layer (112) of the second conductive type;

etching and removing the double hetero structure of the second semiconductor laser device (8) formed on the double hetero structure of the first semiconductor laser device (15);

annealing the double hetero structure of the second semiconductor laser device (8) in an atmosphere of hydride; and forming an impurity film on an end-face portion of the lamination structure, heat-treating the impurity film, diffusing impurities simultaneously onto the first active layer (104) and the second active layer (109), and forming an end-face window structure.

6. The method of manufacturing a monolithic double wavelength semiconductor laser device according to claim 5, wherein the double hetero structure of the first semiconductor laser device is a red semiconductor laser device, and the double hetero structure of the second semiconductor laser device is an infrared semiconductor laser device.

7. The method of manufacturing the monolithic double wavelength semiconductor laser device according to claim 5, wherein the double hetero structure of the first semiconductor laser device is formed prior to the double hetero structure of the second semiconductor laser device.

8. The method of manufacturing the monolithic double wavelength semiconductor laser device according to claim 5, wherein the first semiconductor laser device and the second semiconductor laser device use phosphorus as a V-group element.

* * * * *